United States Patent
Kameda et al.

(10) Patent No.: US 6,984,441 B2
(45) Date of Patent: Jan. 10, 2006

(54) COMPOSITE LAMINATE AND METHOD FOR MANUFACTURING THE SAME

(75) Inventors: Hirokazu Kameda, Kusatsu (JP); Shuya Nakao, Yokaichi (JP); Shigeyuki Kuroda, Sabae (JP); Masaru Kojima, Hikone (JP); Kenji Tanaka, Shiga-ken (JP)

(73) Assignee: Murata Manufacturing Co., Ltd., (JP)

( * ) Notice: Subject to any disclaimer, the term of this patent is extended or adjusted under 35 U.S.C. 154(b) by 100 days.

(21) Appl. No.: 10/192,594

(22) Filed: Jul. 11, 2002

(65) Prior Publication Data

US 2003/0159770 A1    Aug. 28, 2003

Related U.S. Application Data

(62) Division of application No. 09/698,394, filed on Oct. 27, 2000, now Pat. No. 6,579,392.

(30) Foreign Application Priority Data

Oct. 28, 1999  (JP)  ................................. 11-307803

(51) Int. Cl.
*B32B 7/02* (2006.01)
*B32B 3/26* (2006.01)
*B32B 5/16* (2006.01)
*B32B 18/00* (2006.01)
*B32B 9/04* (2006.01)

(52) U.S. Cl. .................. 428/212; 428/213; 428/304.4; 428/320.2; 428/323; 428/325; 428/354; 428/411.1

(58) Field of Classification Search ............ 428/411.1, 428/212, 213, 323, 137, 109, 304.4, 300.7, 428/306.6, 320.2, 325, 354
See application file for complete search history.

(56) References Cited

U.S. PATENT DOCUMENTS

| | | | |
|---|---|---|---|
| 4,313,026 A | | 1/1982 | Yamada et al. |
| 5,102,720 A | * | 4/1992 | Raj .......................... 428/209 |
| 5,277,723 A | | 1/1994 | Kodama et al. |
| 5,474,741 A | | 12/1995 | Mikeska et al. |
| 5,632,942 A | | 5/1997 | Yeh et al. |
| 5,708,570 A | | 1/1998 | Polinski, Sr. |
| 5,740,603 A | | 4/1998 | Kim |
| 5,840,382 A | | 11/1998 | Nishide et al. |
| 6,306,511 B1 | * | 10/2001 | Nakao et al. ............... 428/426 |
| 6,416,855 B1 | * | 7/2002 | Rossignol et al. .......... 428/323 |
| 6,517,924 B1 | * | 2/2003 | Kameda et al. ............. 428/138 |

FOREIGN PATENT DOCUMENTS

| | | |
|---|---|---|
| DE | 35 22 703 A1 | 1/1987 |
| DE | 197 10 187 A1 | 9/1997 |
| EP | 0 535 711 A2 | 10/1992 |
| EP | 0 535 711 A3 | 10/1992 |
| EP | 0 591 733 A1 | 9/1993 |
| EP | 0 954 209 A1 | 4/1999 |
| JP | 07312511 | 11/1995 |
| JP | 8-236936 | 9/1996 |

OTHER PUBLICATIONS

Japanese Office Action issed Feb. 3, 2004 (w/ English translation of relevant portion).
European Search Report dated Aug. 9, 2004.

* cited by examiner

*Primary Examiner*—Rena Dye
*Assistant Examiner*—Lawrence D. Ferguson
(74) *Attorney, Agent, or Firm*—Dickstein, Shapiro, Morin & Oshinsky, LLP.

(57) ABSTRACT

A composite laminate includes first sheet layers and second sheet layers. The first sheet layers include a first particulate aggregate and the second sheet layers include a second particulate aggregate. Each of internal second sheet layers is disposed between two first sheet layers and two external second sheet layers constitute two main faces of the composite laminate. The thickness of the internal second sheet layers is greater than the thickness of the external second sheet layers. The first sheet layers and the second sheet layers are bonded to each other by penetration of a part of the first particulate aggregate contained in the first sheet layers into the second sheet layers. This configuration can reduce the transverse shrinkage in the firing step of the composite laminate.

6 Claims, 7 Drawing Sheets

COMPOSITE LAMINATE AND METHOD FOR MANUFACTURING THE SAME

This is a division of application Ser. No. 09/698,394, filed Oct. 27, 2000, now U.S. Pat. No. 6,579,392.

BACKGROUND OF THE INVENTION

1. Field of the Invention

The present invention relates to composite laminates and to methods for manufacturing the same. In particular, the present invention relates to a composite laminate which shrinks less during firing and to a method for manufacturing the same.

2. Description of the Related Art

In recent years, there have been advances in the reduction in size and weight of chip components. Reduction in size and weight is also required for circuit boards for mounting the chip components. Glass ceramic multilayered circuit boards are useful to meet this need because the glass ceramic multilayered circuit boards allow high-density wiring and reduction in thickness, resulting in reduction in size and weight.

Glass ceramic multilayered circuit boards are generally formed by a sintering process, and they shrink during sintering in a direction perpendicular to the main faces of the boards (longitudinal shrinkage) and in a direction parallel to the main faces (transverse shrinkage). Thus, the current glass ceramic multilayered circuit boards have dimensional variations of approximately ±0.5%. Glass ceramic multilayered circuit boards having cavities for mounting necessary electronic components exhibit noticeable variations.

Japanese Unexamined Patent Application Publication Nos. 5-102666 and 7-330445 disclose methods for making glass ceramic multilayered circuit boards having high dimensional accuracy. Also, Japanese Unexamined Patent Application Publication No. 6-329476 discloses a method for making a glass ceramic multilayered circuit board having cavities. In each method, green sheets which cannot be sintered at the sintering temperature of a glass ceramic compact are laminated on one side or two sides of the glass ceramic compact, and powdered layers of the green sheets are removed after firing.

In such a process, an additional process is required to remove the powdered layers. Moreover, it is difficult to simultaneously fire conductive films, which are preliminarily formed on an unsintered glass ceramic compact, in the firing process. The resulting glass ceramic multilayered circuit board, after removal of the powdered layers, may have a large degree of surface roughness.

In a method disclosed in Japanese Unexamined Patent Application Publication No. 9-266363, a laminate of glass ceramic layers and alumina layers is fired to sinter only the glass ceramic layers so that the glass component contained in the glass ceramic layers penetrates unsintered alumina layers to bind the alumina layers. The glass component in the glass ceramic layers, however, does not penetrate the entity of the alumina layers in this method. Therefore, unbounded portions of the alumina layers are removed and the surfaces are polished before conductive films for circuit patterns are formed.

Although the surface roughness is reduced by the removing and polishing steps in this method, a removing step is required and conductive films cannot be formed on surfaces of the circuit board by simultaneous firing together with the glass ceramic layer.

In a method disclosed in Japanese Unexamined Patent Application Publication No. 5-136572, green sheets which are not sintered at a sintering temperature of a glass ceramic compact, are stacked on one side or two sides of the glass ceramic compact so as to sinter only the glass ceramic compact. Resin is loaded into powdered layers of the unsintered green sheets. This method does not require a step for removing the unsintered powdered layers, but does require a step for loading the powder into the unsintered powdered layers.

SUMMARY OF THE INVENTION

Accordingly, it is an object of the present invention to provide a composite laminate exhibiting reduced transverse shrinkage and high dimensional accuracy.

It is another object of the present invention to provide a method for manufacturing the composite laminate which does not require subsequent steps, such as a removing step and a resin-loading step, after a firing step.

According to a first aspect of the present invention, a composite laminate comprises first sheet layers including a first particulate aggregate and second sheet layers including a second particulate aggregate. Each internal second sheet layers is disposed between two first sheet layers and two of the second sheet layers are external constitute two main faces of the composite laminate. The thickness of the internal second sheet layers is greater than the thickness of the external second sheet layers. The first sheet layers and the second sheet layers are bonded to each other by penetration of a part of the first particulate aggregate contained in the first sheet layers into the second sheet layers.

Preferably, the thickness of the internal second sheet layers is about 1.75 to 2.67 times the thickness of the external second sheet layers.

Preferably, the first sheet layers have substantially the same thickness.

Preferably, the first particulate aggregate contains glass and the second particulate aggregate contains powdered ceramic.

The composite laminate may further comprises a conductive film at one of the interior and the exterior thereof, wherein the first sheet layers, the second sheet layers, and the conductive film constitute a circuit board.

The composite laminate may further comprises a cavity having an opening at least at one main face thereof.

According to a second aspect of the present invention, a method for manufacturing a composite laminate comprises a first step of preparing a green composite laminate including first green sheet layers containing a first particulate aggregate and second green sheet layers containing a second particulate aggregate unsinterable at a temperature for melting at least a part of the first particulate aggregate, wherein each second green sheet layer is disposed between two first green sheet layers, two of the second sheet layers constitute two main faces of the green composite laminate, and the thickness of the second sheet layers laminated in the interior of the green composite laminate is greater than the thickness of the second sheet layers disposed on the main face of the green composite laminate; and a second step of firing the green composite laminate at a temperature capable of melting a part of the first particulate aggregate and incapable of sintering the second particulate aggregate so that the part of the first particulate aggregate contained in the first green sheets is melted and penetrates the second green sheet layers to bond the first green sheet layers and the second sheet layers.

Preferably, the thickness of the second sheet layers laminated in the interior of the green composite laminate is about 1.75 to 2.67 times the thickness of the second sheet layers on the two main faces of the green composite laminate.

Preferably, the first step comprises a first sub-step of forming each of the second green sheet layers on each of the first green sheet layers to form a plurality of first green composite stocks, a second sub-step of laminating the plurality of first green composite stocks to form a plurality of second green composite stocks so that the two first green sheets come into contact with each other, and a third sub-step of laminating the plurality of second green composite stocks so that the two second green sheets come into contact with each other.

Alternatively, the first step comprises a first sub-step of forming each of the first green sheet layers on each of the second green sheet layers to form a plurality of first green composite stocks, a second sub-step of laminating the plurality of first green composite stocks to form a plurality of second green composite stocks so that the two second green sheets come into contact with each other, and a third sub-step of laminating the plurality of second green composite stocks so that the two first green sheets come into contact with each other.

Preferably, the thicknesses of the first green sheet layers are substantially the same in the first step.

Preferably, the first particulate aggregate comprises glass as a primary component and the second particulate aggregate comprises powdered ceramic as a primary component.

According to a third aspect of the present invention, a method for manufacturing a composite laminate comprises a first step comprising the sub-steps of preparing a first particulate aggregate, preparing a second particulate aggregate which is unsinterable at a temperature for melting at least a part of the first particulate aggregate, forming first green sheets containing the first particulate aggregate, forming each of second green sheets containing the second particulate aggregate on each of the first green sheets to form a plurality of first green composite stocks, and laminating the plurality of first green composite stocks to form a green composite laminate so that the two adjacent first green sheets form each of first green sheet layers and the two adjacent second green sheets form each of second green sheet layers; and a second step of firing the green composite laminate at a temperature capable of melting a part of the first particulate aggregate and incapable of sintering the second particulate aggregate so that the part of the first particulate aggregate contained in the first green sheet layers is melted and penetrates the second green sheet layers to bond the first green sheet layers and the second sheet layers.

Preferably, the first green sheet is resistant to a solvent contained in a slurry which is used for forming the second green sheet in the first step.

Preferably, the thicknesses of the first green sheet layers are substantially the same in the first step.

Preferably, the first particulate aggregate comprises glass as a primary component and the second particulate aggregate comprises powdered ceramic as a primary component.

According to a fourth aspect of the present invention, a method for manufacturing a composite laminate comprises a first step comprising the sub-steps of preparing a first particulate aggregate, preparing a second particulate aggregate which is unsinterable at a temperature for melting at least a part of the first particulate aggregate, forming second green sheets containing the second particulate aggregate, forming each of first green sheets containing the first particulate aggregate on each of the second green sheets to form a plurality of first green composite stocks, and laminating the plurality of first green composite stocks to form a green composite laminate so that the two adjacent first green sheets form each of first green sheet layers and the two adjacent second green sheets form each of second green sheet layers; and a second step of firing the green composite laminate at a temperature capable of melting a part of the first particulate aggregate and incapable of sintering the second particulate aggregate so that the part of the first particulate aggregate contained in the first green sheet layers is melted and penetrates the second green sheet layers to bond the first green sheet layers and the second sheet layers.

Preferably, the second green sheet is resistant to a solvent contained in a slurry which is used for forming the first green sheet in the first step.

Preferably, the thicknesses of the first green sheet layers are substantially the same in the first step.

Preferably, the first particulate aggregate comprises glass as a primary component and the second particulate aggregate comprises powdered ceramic as a primary component.

The composite laminate of the present invention exhibits reduced transverse shrinkage and high dimensional accuracy. Moreover, the composite laminate after the firing step can be used without additional steps, such as a removal step and a resin-loading step.

When the first sheet layers have substantially the same thickness, the first sheet layers have substantially the same transverse shrinkage in the firing step, and the second sheet layers suppress the transverse shrinkage. Thus, warping and distortion due to transverse shrinkage are suppressed.

Since the method in accordance with the present invention does not include the removal step of the second sheet layers and the resin-loading step, conductive films formed on the composite laminate and the composite laminate can be simultaneously fired.

In particular, the transverse shrinkage and dimensional variation readily occur in conventional composite laminates having cavities. The composite laminate of the present invention, however, exhibits reduced transverse shrinkage and dimensional variations even when the composite laminate has a cavity due to the above configuration.

The second particulate aggregate contained in the second sheet layer may have any property, for example, insulating, dielectric, piezoelectric or magnetic property. Thus, the resulting composite laminate can exhibit a specific electromagnetic property. An appropriate combination of these properties can produce, for example, an L-C-R composite substrate. When a high-wear-resistance, high-toughness second particulate aggregate is used, the composite laminate can have high mechanical strength. When a light-reflective or IR-reflective second particulate aggregate is used, the composite laminate can have a specific optical function.

DESCRIPTION OF THE PREFERRED EMBODIMENTS

The composite laminate in accordance with the present invention may have a variety of preferred embodiments. Four typical embodiments will be described with reference to FIGS. 1 to 4. In the embodiment shown in each of FIGS. 1 to 4, the composite laminate includes first sheet layers 2, each composed of a first particulate aggregate, and second sheet layers 3a and 3b, each composed of a second particulate aggregate.

Figure 1:
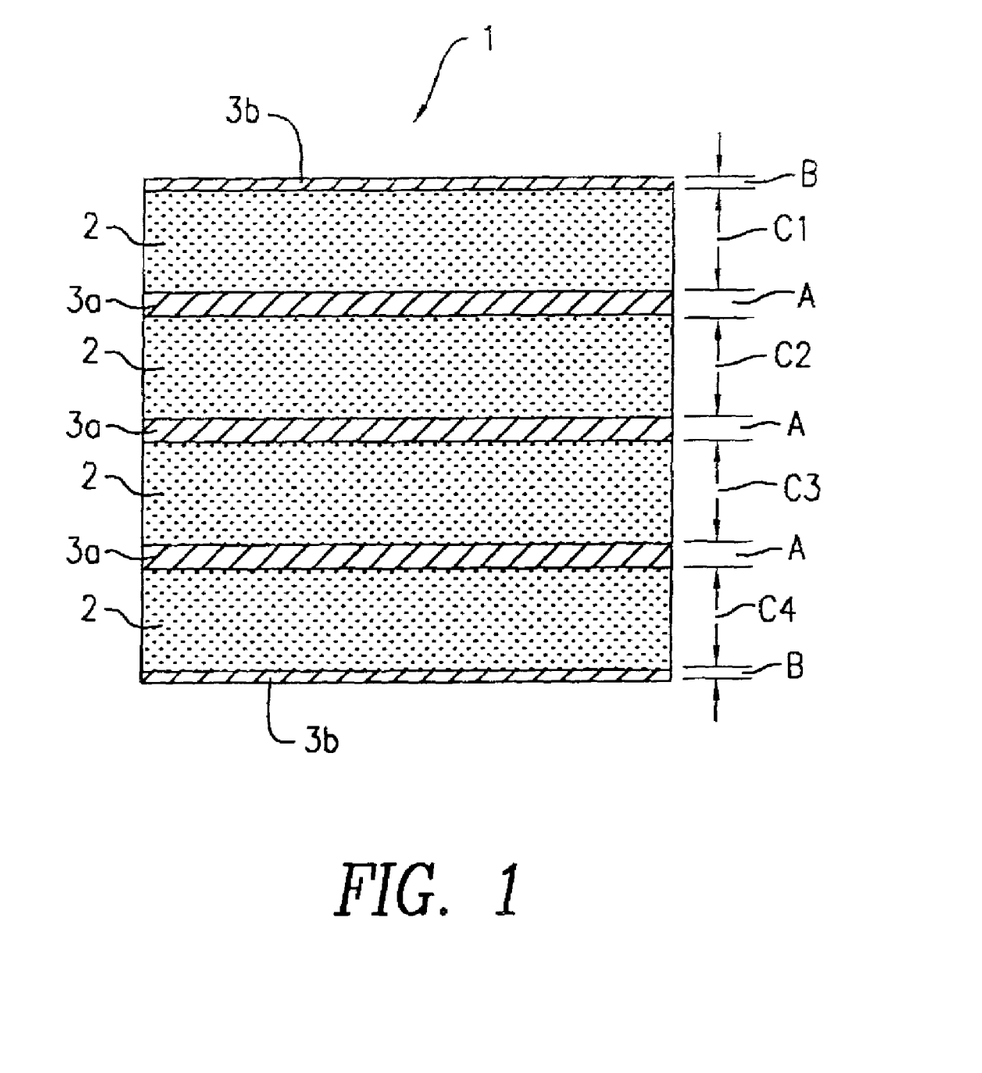
FIG. 1 is a cross-sectional view of a composite laminate of a first embodiment in accordance with the present invention.

With reference to FIG. 1, a composite laminate 1 includes the first sheet layers 2, each composed of the first particulate aggregate, and the second sheet layers 3a and 3b, each composed of the second particulate aggregate. The first sheet layers 2 and the second sheet layers 3a are alternately stacked and the second sheet layers 3b are stacked on the outer faces of the outermost first sheet layers 2 to form two main faces of the composite laminate 1. In this embodiment, the thickness A of the second sheet layers 3a is greater than the thickness B of the second sheet layers 3b. The thicknesses C1 to C4 of the second sheet layers 3b are preferably greater than the thickness A of the second sheet layers 3a. Moreover, the thicknesses C1 to C4 of the second sheet layers 3b are preferably identical.

Figure 2:
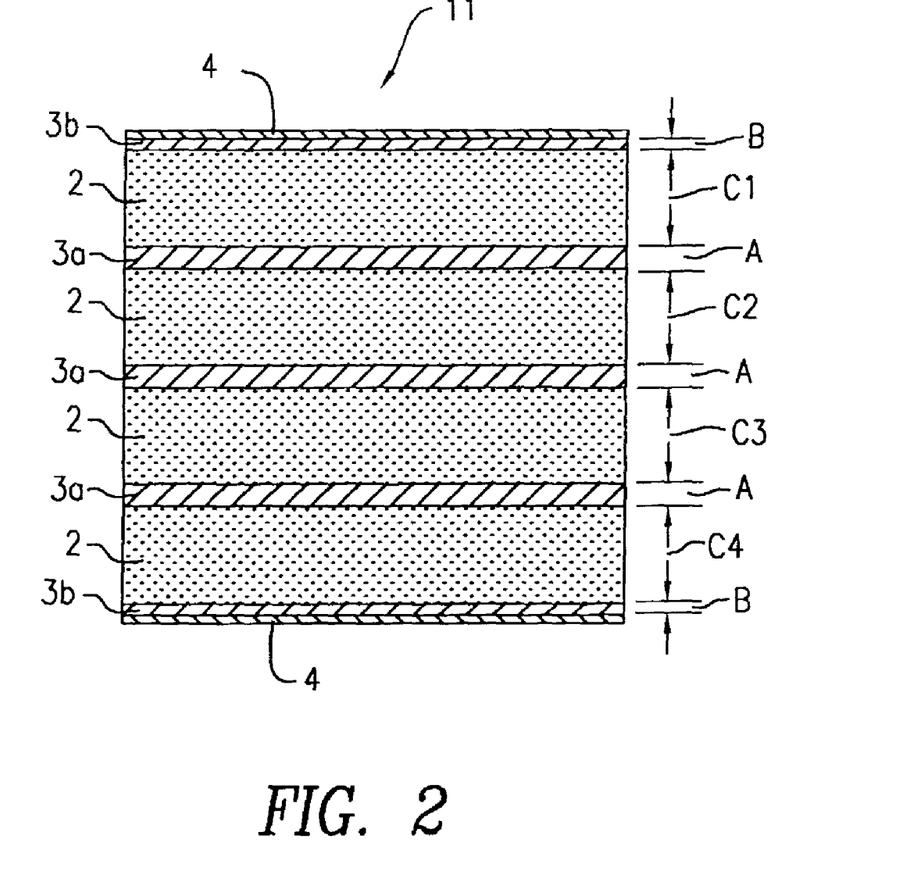
FIG. 2 is a cross-sectional view of a composite laminate of a second embodiment in accordance with the present invention.

With reference to FIG. 2, a composite laminate 11 includes the composite laminate 1 shown in FIG. 1 and conductive films 4 provided on both main faces thereof. The conductive films 4 are formed by a screen printing process using an Ag paste and have predetermined patterns. The Ag paste may be replaced with, for example, an Ag—Pd paste, an Ag—Pt paste, a Cu paste or a Ni paste.

Figure 3:
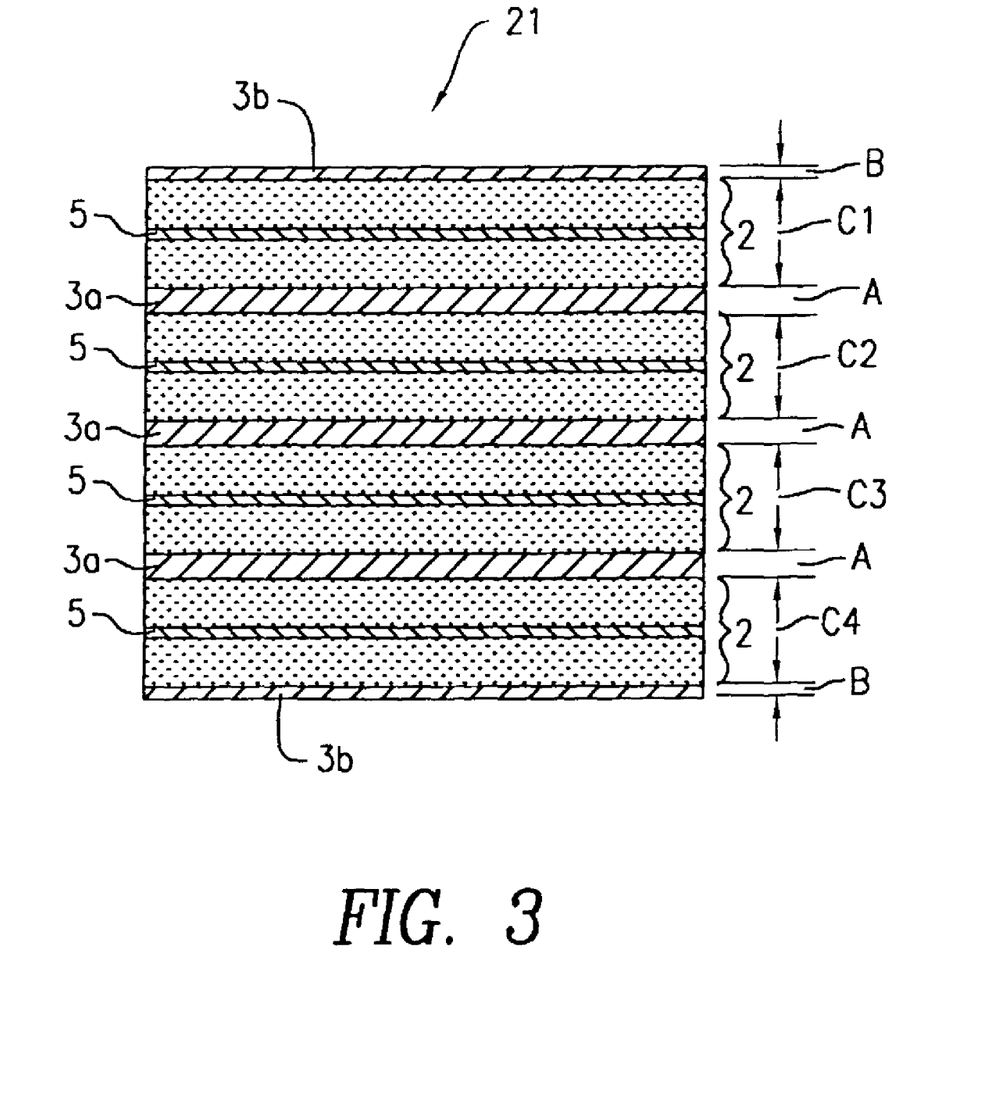
FIG. 3 is a cross-sectional view of a composite laminate of a third embodiment in accordance with the present invention.

With reference to FIG. 3, a composite laminate 21 includes first sheet layers 2 and second sheet layers 3a and 3b. Each first sheet layer 2 includes a conductive film 5 therein. Each conductive film 5 has a predetermined pattern.

Figure 4:
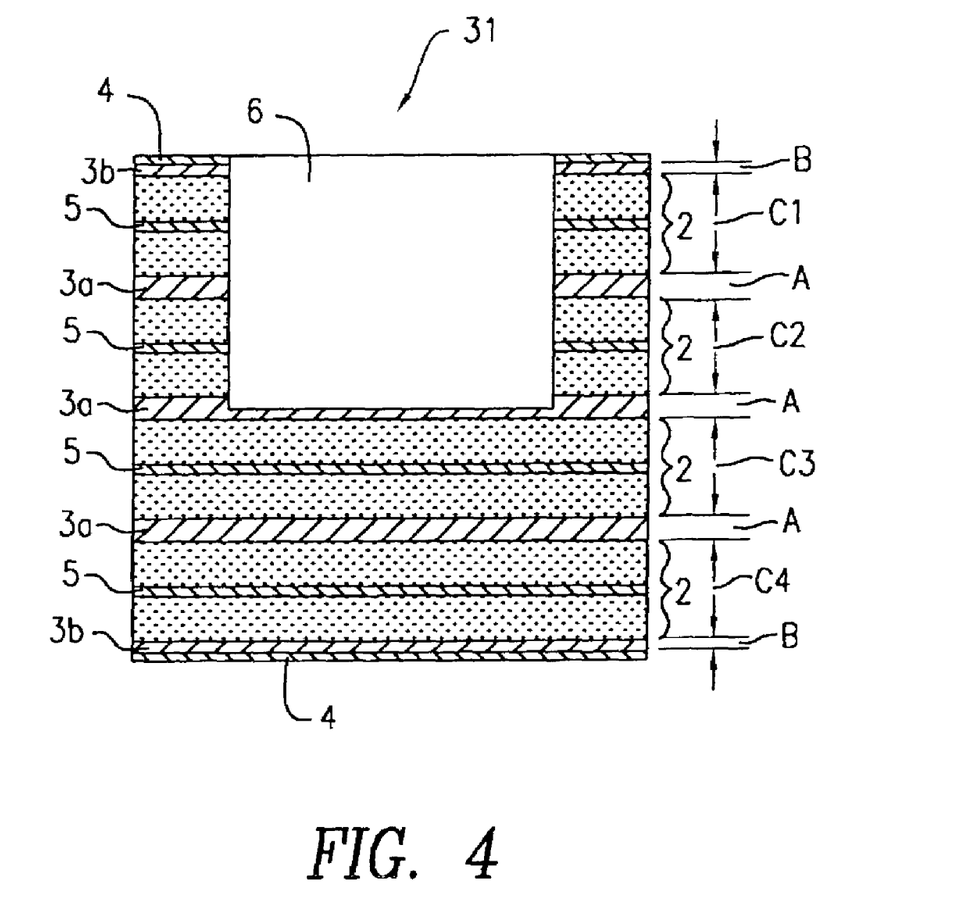
FIG. 4 is a cross-sectional view of a composite laminate of a fourth embodiment in accordance with the present invention.

With reference to FIG. 4, a composite laminate 31 includes a cavity 6 having an opening at one main face thereof. The cavity 6 has a predetermined depth and predetermined transverse dimensions. Moreover, the composite laminate 31 includes conductive films 4, as in the composite laminate 11.

In the composite laminates 1, 11, 21 and 31, it is preferable that the first particulate aggregate in the first sheet layers 2 partly penetrates the entity of the second sheet layers 3a and 3b so that the second particles are completely bounded by the first sheet layer material. The thicknesses of the second sheet layers 3a and 3b are preferably lower than the thicknesses of the first sheet layers 2 to ensure penetration of the first sheet layer material.

The thicknesses of the second sheet layers 3a stacked in the composite laminates 1, 11, 21 and 31 are greater than the thicknesses of the second sheet layers 3b stacked on the main faces of the composite laminates 1, 11, 21 and 31. If the thicknesses of the second sheet layers 3a are less, the composite laminates 1, 11, 21 and 31 will shrink transversely in the vicinity of the center thereof. When the thicknesses of the second sheet layers 3a stacked in the interior are sufficiently great, warping and distortion due to transverse shrinkage are suppressed. In such a case, however, the first particulate aggregate does not penetrate the entity of the second sheet layers 3a and 3b, reducing bonding force between sheets. When the thicknesses of the second sheet layers 3a and 3b are excessively great, the firing temperature must be increased in order to yield a dense glass ceramic compact. The thicknesses of the second sheet layers 3a stacked in the interior of the composite laminates 1, 11, 21 and 31 are preferably about 1.75 times to 2.67 times or more, preferably about 2.0 times, greater than the thicknesses of the second sheet layers 3b.

Preferably, in the composite laminates 1, 11, 21 and 31, the first sheet layers 2 have substantially the same thickness. In such a case, the first sheet layers 2 exhibits substantially the same thermal shrinkage in the firing step while the second sheet layers 3a and 3b suppresses the transverse shrinkage of the first sheet layers 2, resulting in suppressed warping and distortion due to longitudinal and transverse shrinkage of the sintered composite laminates 1, 11, 21 and 31.

It is preferable that the first particulate aggregate in the first sheet layers 2 include glass and the second particulate aggregate in the second sheet layers 3a and 3b include ceramic powder. The glass in the first sheet layers 2 penetrates the second sheet layers 3a and 3b to make the second sheet layers 3a and 3b more dense.

In the composite laminates 11, 21 and 31 provided with the conductive films 4 and/or 5, these conductive films 4 and/or 5 are formed by applying a powdered metal paste on the main and/or internal faces of the green composite, and then by sintering the paste in the firing step of the green composite.

In FIG. 2, the conductive films 4 are provided on the two main faces of the composite laminate 11. Alternatively, a conductive film 4 may be formed on only one main face of the composite laminate 11. The position of the conductive film 4 is also not limited. In FIG. 3, the positions and number of the conductive films 5 provided in the interior of the composite laminate 21 are not limited. In FIG. 4, the positions and the number of the conductive films 4 and 5 may be changed in the composite laminate 31 having the cavity 6. Alternatively, the conductive films 4 and 5 may be omitted in the composite laminate 31. These composites may have through holes and/or via holes for electrically connecting conductive films formed on different layers.

Methods for manufacturing the composite laminates in accordance with the present invention will now be described with reference to FIGS. 5A to 5D, 6A to 6C, and 7, for the composite laminates 1, 21 and 31 shown in FIGS. 1, 3 and 4, respectively.

Figure 5A:
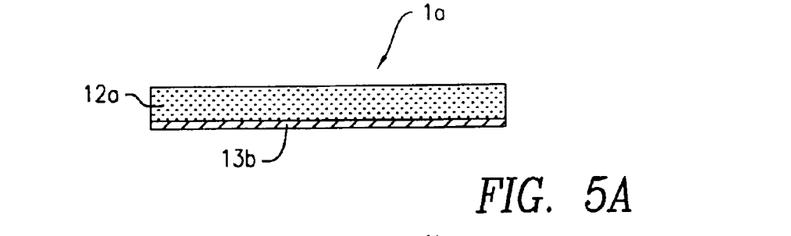
FIGS. 5A to 5D are cross-sectional views for illustrating a method for manufacturing the composite laminate of the first embodiment of the present invention.

The method for manufacturing the composite laminate 1 shown in FIG. 1 is described with reference to FIGS. 5A to 5D. A green sheet is formed using a slurry containing a second particulate aggregate, and another sheet is formed on the green sheet using a slurry containing a first particulate aggregate. The laminated sheet is cut into a predetermined size to form first green composite stocks 1a, each including a second green sheet 13b containing the second particulate aggregate and a first green sheet 12a containing the first particulate aggregate on the second green sheet 13b, as shown in FIG. 5A.

Figure 5B:
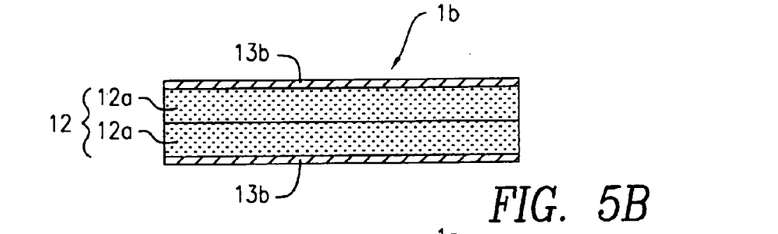

With reference to FIG. 5B, two first green composite stocks 1a are laminated to form a second green composite stock 1b so that the first green sheets 12a are bonded to each other by pressure. The bonded first green sheets 12a are combined to form a first green sheet layer 12.

Figure 5C:
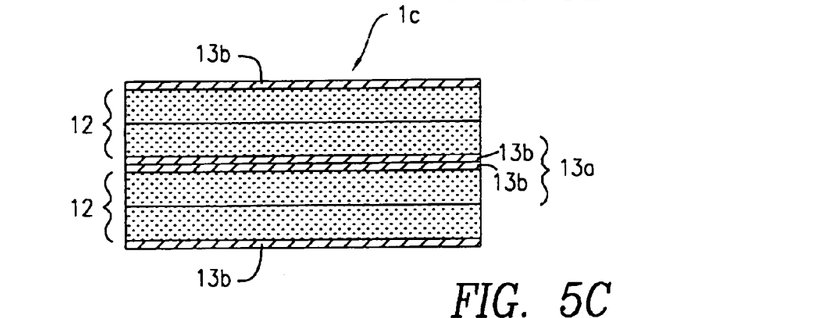

With reference to FIG. 5C, two second green composite stocks 1b are laminated to form a green composite unit 1c so that the second green sheets 13b are bonded to each other by pressure. The bonded second green sheets 13b are combined to form a second green sheet layer 13a.

Figure 5D:
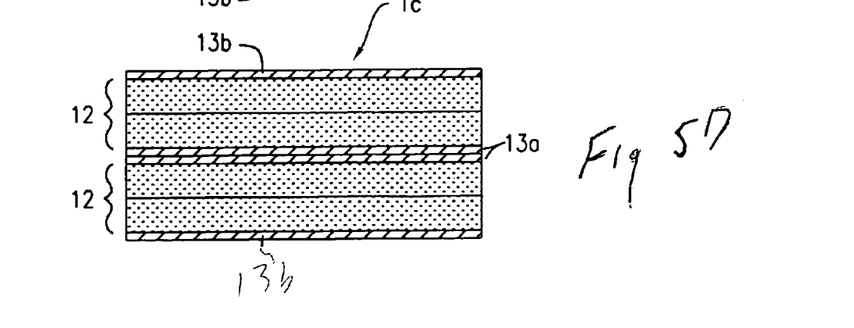

With reference to FIG. 5D, two green composite units 1c are laminated to form a green composite laminate so that the second green sheets 13b are bonded to each other by pressure. The green composite laminate is fired to form the composite laminate 1 shown in FIG. 1.

The method for manufacturing the composite laminate 21 shown in FIG. 3 is described with reference to FIGS. 6A to 6C. Components having the same functions as in FIGS. 5A to 5D are referred to with the same reference numerals, and a detailed description thereof with reference to drawings is omitted.

Figure 6A:
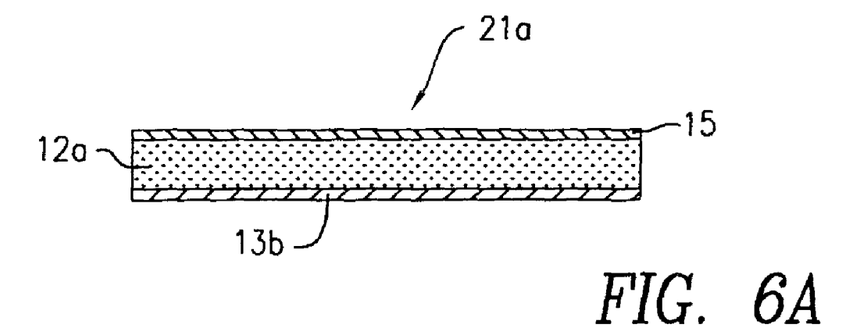
FIGS. 6A to 6C are cross-sectional views for illustrating a method for manufacturing the composite laminate of the third embodiment of the present invention.

With reference to FIG. 6A, a conductive film 15 is formed on the first green sheet 12a of the first green composite stock 1a shown in FIG. 5A to form a first green composite stock 21a. Since the conductive film 15 has a predetermined pattern, the first green sheet 12a may be partly exposed on one main face of the first green composite stock 21a.

Figure 6B:
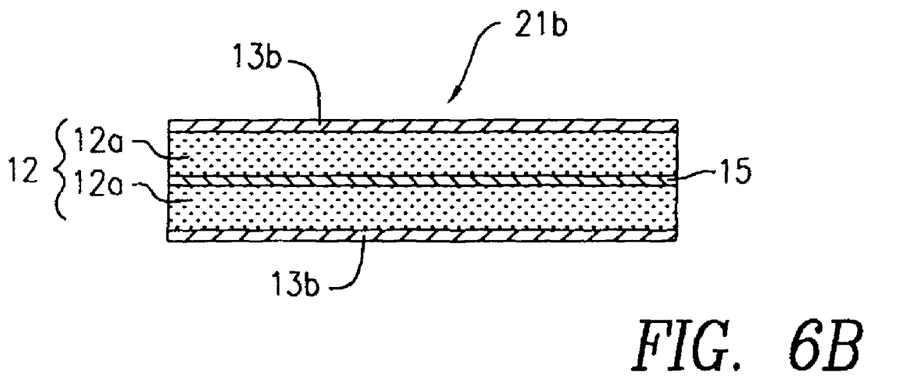

With reference to FIG. 6B, another first green composite stock 1a and the first green composite stock 21a are laminated to form a second green composite stock 21b so that the two first green sheets 12a are bonded to each other via the conductive film 15 by pressure. The two first green sheets 12a are combined to form a first green sheet layer 12 including the conductive film 15.

Figure 6C:
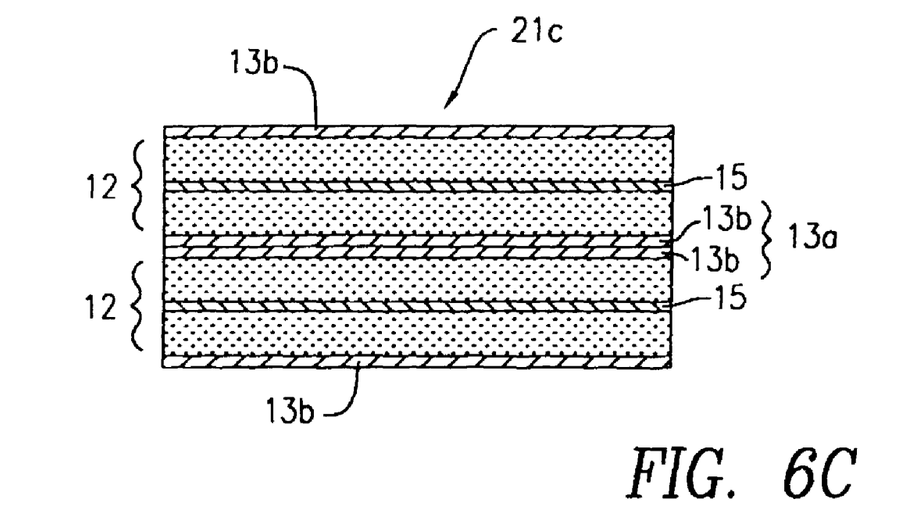

With reference to FIG. 6C, the two second green composite stocks 21b are laminated to form a green composite unit 21c so that the second green sheets 13b are bonded to each other by pressure. The two second green sheets 13b are combined to form a second green sheet layer 13a.

Two green composite units 21c are laminated to form a green composite laminate so that the two second green sheets 13b are bonded to each other by pressure. The green composite laminate is fired to form the composite laminate 21 shown in FIG. 3.

Figure 7:
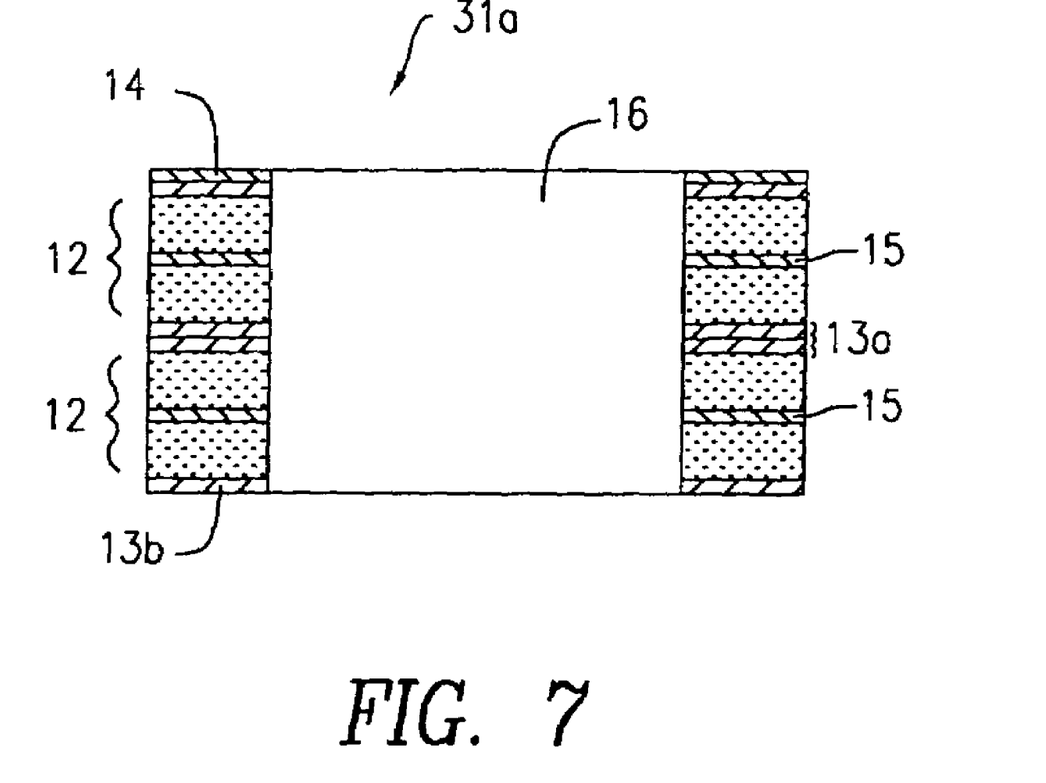
FIG. 7 is a cross-sectional view for illustrating a method for manufacturing the composite laminate of the fourth embodiment of the present invention.

The method for manufacturing the composite laminate 31 is described with reference to FIG. 7. Components having the same functions as in FIGS. 5A to 5D and 6A to 6C are referred to with the same reference numerals, and a detailed description thereof with reference to drawings is omitted.

A green composite unit 21c shown in FIG. 6C is prepared. A conductive film 14 is formed by printing on one main face of the green composite unit 21c using a conductive paste. A cavity 16 having an opening at the main face provided with the conductive film 14 is formed by punching to form a green composite unit 31a.

The green composite unit 31a and a green composite unit 21c shown in FIG. 6C are laminated to form a green composite laminate so that two second green sheets 13b are bonded to each other by pressure. The green composite laminate is fired to form the composite laminate 31 shown in FIG. 4.

In FIGS. 5A and 6A, the first green sheets 12a are formed on the second green sheets 13b to form the first green composite stocks 1a and 21a. Alternatively, the second green sheets 13b may be formed on the first green sheets 12a.

The first green sheet 12a and the second green sheet 13b may be formed by a doctor blade process, a gravure process, a dipping process, a spray process, a rolling process, a thin-film forming process or a powder compression process.

When a second sheet is formed on a first sheet, it is preferable that the first sheet be resistant to the solvent which is used in the slurry for forming the second sheet. For example, when the first green sheet 12a is formed on the second green sheet 13b, the second green sheet 13b is resistant to the solvent which is used in the slurry for forming the first green sheet 12a. If the first sheet is not resistant to the solvent, the first sheet will dissolve in the solvent contained in the second sheet, and the second sheet will not be satisfactorily laminated.

In the methods shown in FIGS. 5A to 5D and 6A to 6C, the conductive film 5 is formed on the first green sheet 12a. However, the position and the shape of the conductive film 15 are not limited to the above embodiments. For example, the conductive film may be formed on the second green sheet 13b of the first green composite stock 1a shown in FIG. 5A.

The composite laminates are schematically shown in FIGS. 1 to 4. Since the first particulate aggregate contained in the green first sheet layer 2 partly penetrates the second sheet layers 3a and 3b during firing, the boundaries between the first sheet layer 2 and the second sheet layers 3a and 3b may not be always as distinct as illustrated in FIGS. 1 to 4.

EXAMPLES

Seven composite laminates 1 were prepared as follows to measure transverse shrinkage factors, in which the second sheet layers 3a laminated in the interior of the composite laminates 1 and the second sheet layers 3b formed on the main faces of the composite laminates 1 had different thicknesses.

A second slurry including a second particulate aggregate was prepared by mixing and dispersing 100 parts by weight of alumina powder having a particle diameter of 0.5 $\mu$m as second particles, 45 parts by weight of water as a dispersant, 50 parts by weight of polyalkylene glycol as another dispersant, and 15 parts by weight of urethane resin emulsion as a binder. The second slurry may contain plasticizers, defoamers and tackifiers.

After defoaming, the second slurry was applied and dried onto a polyethylene terephthalate (PET) film by a gravure process to form green sheets as second green sheets, each having a thickness of 1.0 $\mu$m, 1.5 $\mu$m, 2.0 $\mu$m or 4.0 $\mu$m. The urethane resin emulsion was converted into water-insoluble gel during the drying step. Thus, these green sheets were resistant to an aqueous slurry.

A first slurry including a first particulate aggregate was prepared by mixing and dispersing 60 parts by weight of B—Si—Ca—Al—O-based glass having a diameter of 3.0 $\mu$m as first particles, 40 parts by weight of alumina powder having a diameter of 0.5 $\mu$m also as first particles, 36 parts by weight of water as a dispersant, 1 part by weight of polyalkylene glycol as another dispersant, and 12 parts by weight of urethane resin emulsion as a binder. The first slurry may contain plasticizers, defoamers and tackifiers.

The first slurry was applied onto one main face of each green sheet as the second green sheet to form a green sheet having a thickness of 75 $\mu$m as a first green sheet. First green composites were thereby prepared.

The two first green composites were laminated at 60° C. and 2,000 kgf/cm$^2$ to form a second green composite so that the first green sheets were bonded to each other. In this step, these two first green sheets having a thickness of 75 $\mu$m were combined by pressure to form a first green sheet layer having a thickness of 140 $\mu$m.

Three second green composites were laminated at 60° C. and 100 kgf/cm² so that the second green sheets were bonded to each other by pressure. The composite was cut into a square of 100 mm×100 mm to form a green composite laminate. In this step, the adjacent two second green sheets were combined to form a second green sheet layer.

When the second green sheet layers, which were laminated in the interior of the composite laminate, had a thickness of 2.0 μm, two second green sheets having a thickness of 1.0 μm were combined. When the second green sheet layers had a thickness of 3.0 μm, two second green sheets having a thickness of 1.5 μm were combined. When the second green sheet layers had a thickness of 3.5 μm, a second green sheets having a thickness of 1.5 μm and a second green sheets having a thickness of 2.0 μm were combined. When the second green sheet layers had a thickness of 4.0 μm, two second green sheets having a thickness of 2.0 μm were combined.

For comparison, a laminate (sample No. 8) having a thickness of 420 μm was formed by preparing six green sheets, each having a thickness of 75 μm, using the first slurry, laminating the six green sheets at 60° C. under a pressure of 100 kgf/cm², and cutting the laminate into a square of 100 mm×100 mm.

The resulting green composite laminates (sample Nos. 1 to 7) and the green laminate (sample No. 8) were fired at a temperature in a range of 700° C. to 1,000° C., for example, at 850° C. for 2 hours in air to form composite laminates (sample Nos. 1 to 7) and a laminate (sample No. 8). In sample Nos. 1 to 7, the alumina particles contained in the first particulate aggregate and the second particulate aggregate were not sintered during the firing step, whereas the glass powder contained in the first particulate aggregate was melted and penetrated the second sheet layers from the first sheet layers. After cooling, the melt glass was solidified to bind the first sheet layers and the second sheet layers.

In sample Nos. 1 to 7, the thickness of the second sheet layers formed in the interior of the composite laminate (referred to as "internal layers" in Table 1), the thickness of the second sheet layer formed on the main face (referred to as "external layers" in Table 1), and the transverse shrinkage factor were measured. In sample No. 8, the transverse shrinkage factor was measured. The results are summarized in Table 1.

In the column "Evaluation", A indicates that the sample has a small transverse shrinkage factor and high dimensional accuracy, B indicates that the sample has a small transverse shrinkage factor and average dimensional accuracy, and C indicates that the sample has a large transverse shrinkage factor and poor dimensional accuracy.

In sample Nos. 1 to 7, the second sheet layers are provided in order to suppress the longitudinal shrinkage. The thickness of the first green sheet layer decreases from 140 μm to 100 μm by longitudinal shrinkage during firing. The total thicknesses of the composite laminates in sample Nos. 1 to 7 and the laminate in sample No. 8 are shown in Table 1. The green second sheet layer does not substantially shrink longitudinally during firing.

TABLE 1

| Sample | Total Thickness of Composite Laminate (μm) | | Thickness of Second Sheet Layers (μm) | | Ratio of Internal Layer to External Layer | Firing Temperature (° C.) | Transverse Shrinkage Factor (%) | Evaluation |
|---|---|---|---|---|---|---|---|---|
| | Before Firing | After Firing | External Layers | Internal Layers | | | | |
| 1 | 420 | 300 | 2.0 | 4.0 | 2.00 | 850 | 0.3 | A |
| 2 | 420 | 310 | 2.0 | 2.0 | 1.00 | 850 | 2.3 | C |
| 3 | 420 | 300 | 4.0 | 4.0 | 1.00 | 900 | 0.3 | C |
| 4 | 420 | 305 | 2.0 | 3.0 | 1.50 | 850 | 1.4 | B |
| 5 | 420 | 300 | 2.0 | 3.5 | 1.75 | 850 | 0.5 | A |
| 6 | 420 | 305 | 1.0 | 4.0 | 4.00 | 850 | 1.1 | B |
| 7 | 420 | 300 | 1.5 | 4.0 | 2.67 | 850 | 0.4 | A |
| 8 | 420 | 375 | — | — | — | 850 | 11.0 | C |

Notes: Firing temperature in Table 1 indicates a minimum temperature for facilitating penetration of glass into the second sheet layer and for forming a dense laminate.

The second sheet layer does not transversely shrink during firing and the thickness thereof does not vary by firing.

As shown in Table 1, each of sample Nos. 1, 4, 5, 6 and 7 has a ratio of the thickness of the internal second sheet layer to the thickness of the external second sheet layer of 1.0 or more, can be sintered at 850° C., and exhibits a small transverse shrinkage factor within a range of 0.3% to 1.4%. In contrast, sample No. 8 exhibits a transverse shrinkage factor as high as 11.0%.

In particular, each of sample Nos. 1, 5 and 7 has a ratio in a range of 1.75 to 2.67, can be sintered at 850° C., and exhibits a particularly small transverse shrinkage factor within a range of 0.3% to 0.5%. These composites, therefore, show high dimensional accuracy.

Sample No. 2, which can be sintered at 850° C., exhibits a transverse shrinkage factor of 2.3%, which is two times that of sample No. 4. This composite does not show satisfactory dimensional accuracy.

Sample No. 3, which exhibits a small transverse shrinkage factor of 0.3%, cannot be sintered at 850° C. and must be sintered at 900° C.

The first particulate aggregate contained in the first sheet layer and the second particulate aggregate contained in the second sheet layer may be particulate aggregates of MgO, $ZrO_2$, $SiO_2$, $TiO_2$, $BaTiO_3$, $SrTiO_3$, $MgO_3$, $Fe_2O_3$, RuO, $(Zr,Ti)O_3$, $B_4C$, SiC and/or WC.

What is claimed is:

1. A composite laminate having two main external face layers and a plurality of internal layers therebetween, comprising:

at least two first sheet layers each comprising a first particulate aggregate; and at least three second sheet layers each comprising a second particulate aggregate;

wherein two of the second sheet layers constitute the two main external faces of the composite laminate, each internal second sheet layer is disposed between two first sheet layers, the thickness of the internal second sheet layers is greater than the thickness of the external face second sheet layers, and a part of the first particulate aggregate of the first sheet layers is penetrated into the second sheet layers and bonds the first sheet layers to the second sheet layers.

2. A composite laminate according to claim 1, wherein the thickness of the internal second sheet layers is about 1.75 to 2.67 times the thickness of the external face second sheet layers.

3. A composite laminate according to claim 2, wherein each of the first sheet layers have substantially the same thickness.

4. A composite laminate according to claim 3, wherein the first particulate aggregate comprises powdered glass and the second particulate aggregate comprises powdered ceramic.

5. A composite laminate according to claim 4, further comprising a conductive film, whereby the first sheet layers, the second sheet layers and the conductive film constitute a circuit board.

6. A composite laminate according to claim 5, further comprising a cavity having an opening at least at one main face thereof.

* * * * *